(12) United States Patent
Moncavage

(10) Patent No.: US 9,327,490 B2
(45) Date of Patent: May 3, 2016

(54) SCREEN PRINTING MACHINE AND METHOD HAVING VISION CAMERA COUPLED TO MATERIAL-DISPENSING EFFECTOR

(75) Inventor: Charles Moncavage, Nazareth, PA (US)

(73) Assignee: ASM Assembly Systems Switzerland GmbH, Zurich (CH)

( * ) Notice: Subject to any disclaimer, the term of this patent is extended or adjusted under 35 U.S.C. 154(b) by 891 days.

(21) Appl. No.: 12/527,954

(22) PCT Filed: Feb. 19, 2008

(86) PCT No.: PCT/EP2008/001275
§ 371 (c)(1),
(2), (4) Date: Apr. 22, 2010

(87) PCT Pub. No.: WO2008/101663
PCT Pub. Date: Aug. 28, 2008

(65) Prior Publication Data
US 2010/0206189 A1    Aug. 19, 2010

Related U.S. Application Data

(60) Provisional application No. 60/890,675, filed on Feb. 20, 2007.

(51) Int. Cl.
*B41F 15/40* (2006.01)
*H05K 3/00* (2006.01)
(Continued)

(52) U.S. Cl.
CPC .............. *B41F 15/40* (2013.01); *H05K 3/0008* (2013.01); *H05K 3/1216* (2013.01);
(Continued)

(58) Field of Classification Search
CPC ........ B41F 15/40; B41M 1/12; H05K 3/1216; H05K 3/0008; H05K 3/125; H05K 2203/0126; H05K 2203/013; H05K 2203/0195; H05K 2203/107

USPC .......................................... 101/123, 126, 129
See application file for complete search history.

(56) References Cited

U.S. PATENT DOCUMENTS 5,110,615 A * 5/1992 Maiorca et al. .................... 427/8
5,709,905 A * 1/1998 Shaw et al. ........................ 427/8
(Continued)

FOREIGN PATENT DOCUMENTS

CN    1796109    7/2006
EP    1448032    8/1996
(Continued)

OTHER PUBLICATIONS

International Search Report for corresponding application No. PCT/EP2008/001275 completed Jul. 16, 2008.

*Primary Examiner* — Leslie J Evanisko
(74) *Attorney, Agent, or Firm* — Renner, Otto, Boisselle & Sklar, LLP

(57) ABSTRACT

A screen printing machine and method, the screen printing machine comprising: a print head (111) which is operable to drive a material through a printing screen (109) and deposit the material onto a workpiece (w); an imaging unit (121) which comprises a vision camera (123) for imaging at least one of the printing screen (109) and the workpiece (w), and a positioning mechanism (125) which is operable to position the vision camera; and an end effector (141) which is operable to perform an operation on the workpiece and is coupled to the vision camera, such as to be moved commonly therewith by the positioning mechanism, wherein the screen printing machine is operable in one of a first mode in which the print head is operated to print material deposits on the workpiece, and a second, mode in which the end effector is actuated to perform an operation on the workpiece at defined positions.

27 Claims, 5 Drawing Sheets

(51) Int. Cl.
   *H05K 3/12* (2006.01)
   *H05K 1/02* (2006.01)
   *H05K 3/34* (2006.01)

(52) U.S. Cl.
   CPC ............ *H05K 1/0269* (2013.01); *H05K 3/125* (2013.01); *H05K 3/3484* (2013.01); *H05K 2203/013* (2013.01); *H05K 2203/0126* (2013.01); *H05K 2203/0195* (2013.01); *H05K 2203/107* (2013.01)

(56) References Cited

U.S. PATENT DOCUMENTS

| | | | |
|---|---|---|---|
| 5,792,268 A * | 8/1998 | Averell | 118/500 |
| 5,794,329 A * | 8/1998 | Rossmeisl et al. | 29/743 |
| 6,212,751 B1 * | 4/2001 | Hattori | 29/407.04 |
| 6,510,356 B2 * | 1/2003 | Seshan | 700/95 |
| 6,814,810 B2 * | 11/2004 | Prentice et al. | 118/677 |
| 6,820,545 B2 * | 11/2004 | Yamasaki et al. | 101/123 |
| 7,548,798 B2 * | 6/2009 | Bang et al. | 700/253 |
| 2004/0149151 A1 * | 8/2004 | Yamasaki et al. | 101/123 |
| 2005/0142293 A1 * | 6/2005 | Ready et al. | 427/258 |
| 2005/0268799 A1 * | 12/2005 | Pham-Van-Diep et al. | 101/123 |
| 2006/0124003 A1 | 6/2006 | Sakaida | |
| 2007/0102477 A1 * | 5/2007 | Prince | 228/39 |
| 2010/0116157 A1 * | 5/2010 | Plachy et al. | 101/126 |

FOREIGN PATENT DOCUMENTS

| | | | |
|---|---|---|---|
| EP | 0820863 | | 7/1997 |
| EP | 0820863 | | 1/1998 |
| EP | 1448032 | | 8/2004 |
| GB | 2344312 | | 8/1999 |
| GB | 2344312 | | 6/2000 |
| GB | 2377908 A | * | 1/2003 |
| JP | 5-160549 | | 6/1993 |
| JP | 7-185999 | | 7/1995 |
| JP | 10-217427 | | 8/1998 |
| WO | 01/67835 | | 9/2001 |
| WO | WO 0167835 A1 | * | 9/2001 |
| WO | 02/097534 | | 12/2002 |
| WO | 2008/128754 | | 10/2008 |

* cited by examiner

SCREEN PRINTING MACHINE AND METHOD HAVING VISION CAMERA COUPLED TO MATERIAL-DISPENSING EFFECTOR

This application is a national phase of International Application No. PCT/EP2008/001275 filed Feb. 19, 2008 and published in the English language.

The present invention relates to a screen printing machine, in particular a surface mount technology (SMT) screen printing machine, which provides for additional functionality, in incorporating an additional end effector, such as a material-dispensing effector for enabling the dispensing of deposits of a material onto a workpiece in addition to the conventional printing operation, and a method of operating such a screen printing machine.

Conventionally, an SMT assembly line includes a plurality of dedicated machines, which separately perform operations on a workpiece, typically a printed circuit board, as required in an SMT process, including a screen printing machine for performing a screen printing operation to print workpieces through a printing screen with a pattern of material deposits, such as of solder paste or adhesive, and a dispensing machine for dispensing material deposits, again such as of solder paste or adhesive, directly onto a workpiece. In some cases, it is necessary both to screen print and dispense material deposits onto a workpiece.

Such screen printing machines are supplied, for example, by DEK INTERNATIONAL GMBH (Zürich, Switzerland), EKRA AUTOMATISIERUNGSSYSTEME GMBH (Bönningheim, Germany) and SPEEDLINE TECHNOLOGIES, INC. (Franklin, Mass., USA).

The present inventor has recognized that a screen printing machine can be configured to provide a further operation, in particular a material-dispensing operation, through the provision of an end effector in conjunction with the vision camera, which, as part of the alignment mechanism, is moved over the surface of a workpiece as supported in the screen printing machine and referenced thereto, such as to allow the end effector to be positioned by reference to the vision camera.

This use of a screen printing machine advantageously allows for the extended use of a screen printing machine, and also avoids the need for a dedicated piece of equipment to perform an operation which may be required infrequently. Such equipment is both expensive and requires the allocation of floorspace, which may be better utilized.

In one aspect the present invention provides a screen printing machine, comprising: a print head which is operable to drive a material through a printing screen and deposit the material onto a workpiece; an imaging unit which comprises a vision camera for imaging at least one of the printing screen and the workpiece, and a positioning mechanism which is operable to position the vision camera; and an end effector which is operable to perform an operation on the workpiece and is coupled to the vision camera, such as to be moved commonly therewith by the positioning mechanism; wherein the screen printing machine is operable in one of a first mode in which the print head is operated to print material deposits on the workpiece, and a second mode in which the end effector is actuated to perform an operation on the workpiece at defined positions.

In one embodiment the screen printing machine is operable in one of a first mode in which only the print head is operated to print material deposits on the workpiece, a second mode in which, preferably successively, the print head is operated to print material deposits on the workpiece and the end effector is actuated to perform an operation on the workpiece at defined positions, and a third mode in which only the end effector is actuated to perform an operation on the workpiece at defined positions.

In one embodiment the positioning mechanism is operable to position the vision camera between the printing screen and the workpiece.

In one embodiment the screen printing machine further comprises: a frame support for supporting a printing screen unit which includes a printing screen having a pattern of apertures therein.

In one embodiment the screen printing machine further comprises: an alignment unit for aligning the printing screen unit relative to the workpiece in response to features imaged on at least one of the printing screen and the workpiece.

In one embodiment the screen printing machine further comprises: a workpiece support for supporting the workpiece.

In one embodiment the positioning mechanism is operable to position the vision camera in an X-Y plane.

In one embodiment the positioning mechanism comprises an X-Y gantry.

In one embodiment the positioning mechanism comprises first and second positioning units, which provide for positioning of the vision camera in respective ones of orthogonal, X-Y axes, such as to be operable together to provide for positioning of the vision camera in the X-Y plane.

In one embodiment one, first positioning unit comprises first and second positioners, which are mounted in parallel relation, and a bridge member, which interconnects the first and second positioners, and is moved by common operation of the first and second positioners to position the vision camera in one axis.

In one embodiment the first positioning unit comprises at least one actuator for actuating the first and second positioners thereof.

In one embodiment the at least one actuator comprises one of a stepping motor or a servo motor.

In one embodiment the first positioning unit comprises a single actuator for actuating the first and second positioners thereof.

In one embodiment the other, second positioning unit comprises a positioner, which is mounted to the bridge member of the first positioning unit in orthogonal relation to the first and second positioners thereof, and is operable to position the vision camera in the other, orthogonal axis.

In one embodiment the second positioning unit comprises an actuator for actuating the positioner thereof.

In one embodiment the actuator comprises one of a stepping motor or a servo motor.

In one embodiment the end effector is a material-dispensing effector for dispensing material deposits onto the workpiece in a desired pattern.

In one embodiment the material-dispensing effector is controlled to dispense material deposits in dependence upon the movement thereof.

In one embodiment the materials as deposited by the print head and the end effector are different.

In another embodiment the materials as deposited by the print head and the end effector are the same.

In one embodiment the materials are selected from a solder paste, a solder flux and an adhesive.

In another embodiment the end effector is an ink-jetting effector for delivering a liquid to the workpiece in a desired pattern.

In a further embodiment the end effector is a component-mounting effector for mounting components at defined locations on the workpiece.

In a still further embodiment the end effector is a laser-etching effector for laser etching a desired pattern in the workpiece.

In another aspect the present invention provides a screen printing machine, comprising: a print head which is operable to drive a material through a printing screen and deposit the material onto a workpiece; an imaging unit which comprises a vision camera for imaging at least one of the printing screen and the workpiece and a positioning mechanism which is operable to position the vision camera; and an end effector which is operable to perform an operation on the workpiece and is coupled to the vision camera, such as to be moved commonly therewith by the positioning mechanism; wherein the screen printing machine is operable in one of a first mode in which the print head is operated to print material deposits on the workpiece, and a second mode in which the print head is operated to print material deposits on the workpiece and the end effector is actuated to perform an operation on the workpiece at defined positions.

In a further aspect the present invention provides a method of operating a screen printing machine, which comprises a print head which is operable to drive a material through a printing screen and deposit the material onto a workpiece, an imaging unit which comprises a vision camera for imaging at least one of the printing screen and the workpiece and a positioning mechanism which is operable to position the vision camera, and an end effector which is operable to perform an operation on the workpiece and is coupled to the vision camera, such as to be moved commonly therewith, the method comprising the step of: operating the screen printing machine in one of a first mode in which the print head is driven to print material deposits on a workpiece, and a second mode in which the end effector is actuated to perform an operation on the workpiece at defined positions.

In one embodiment the screen printing machine operating step comprises the step of: operating the screen printing machine in one of a first mode in which only the print head is driven to print material deposits on a workpiece, a second mode in which, preferably successively, the print head is driven to print material deposits on a workpiece and the end effector is actuated to perform an operation on the workpiece at defined positions, and a third mode in which only the end effector is actuated to perform an operation on a workpiece at defined positions.

In one embodiment the positioning mechanism is operable to position the vision camera between the printing screen and the workpiece.

In one embodiment the method further comprises the steps of: operating the imaging unit to move the vision camera and image features on at least one of the printing screen and the workpiece; and aligning the printing screen relative to the workpiece in response to the imaged features.

In one embodiment the end effector is a material-dispensing effector for dispensing material deposits onto the workpiece in a desired pattern.

In one embodiment the material-dispensing effector is controlled to dispense material deposits in dependence upon the movement thereof.

In one embodiment the materials as deposited by the print head and the end effector are different.

In another embodiment the materials as deposited by the print head and the end effector are the same.

In one embodiment the materials are selected from a solder paste, a solder flux and an adhesive.

In another embodiment the end effector is an ink-jetting effector which is actuated to deliver a liquid to the workpiece in a desired pattern.

In a further embodiment the end effector is a component-mounting effector which is actuated to mount components at defined locations on the workpiece.

In a still further embodiment the end effector is a laser-etching effector which is actuated to laser etch a desired pattern in the workpiece.

In one embodiment the workpiece is a printed circuit board.

In a still further aspect the present invention provides a method of operating a screen printing machine, which comprises a print head which is operable to drive a material through a printing screen and deposit the material onto a workpiece, an imaging unit which comprises a vision camera for imaging at least one of the printing screen and the workpiece and a positioning mechanism which is operable to position the vision camera, and an end effector which is operable to perform an operation on the workpiece and is coupled to the vision camera, such as to be moved commonly therewith, the method comprising the step of: operating the screen printing machine in one of a first mode in which the print head is driven to print material deposits on a workpiece, and a second mode in which the print head is driven to print material deposits on a workpiece and the end effector is actuated to perform an operation on the workpiece at defined positions.

A preferred embodiment of the present invention will now be described hereinbelow by way of example only with reference to the accompanying drawings, in which.

Figure 1:
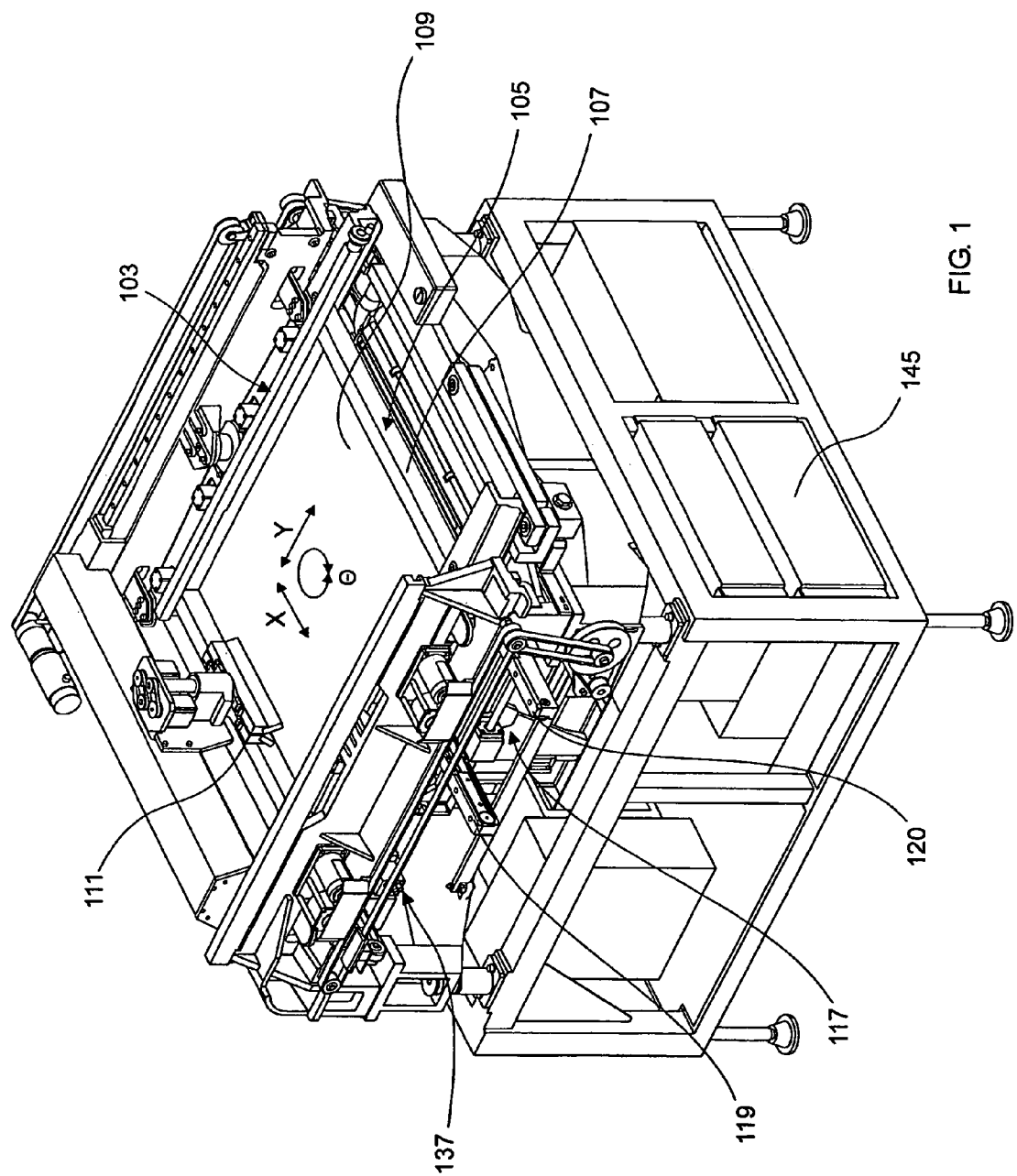
FIG. 1 illustrates a perspective view of a screen printing machine in accordance with a preferred embodiment of the present invention.
Figure 2:
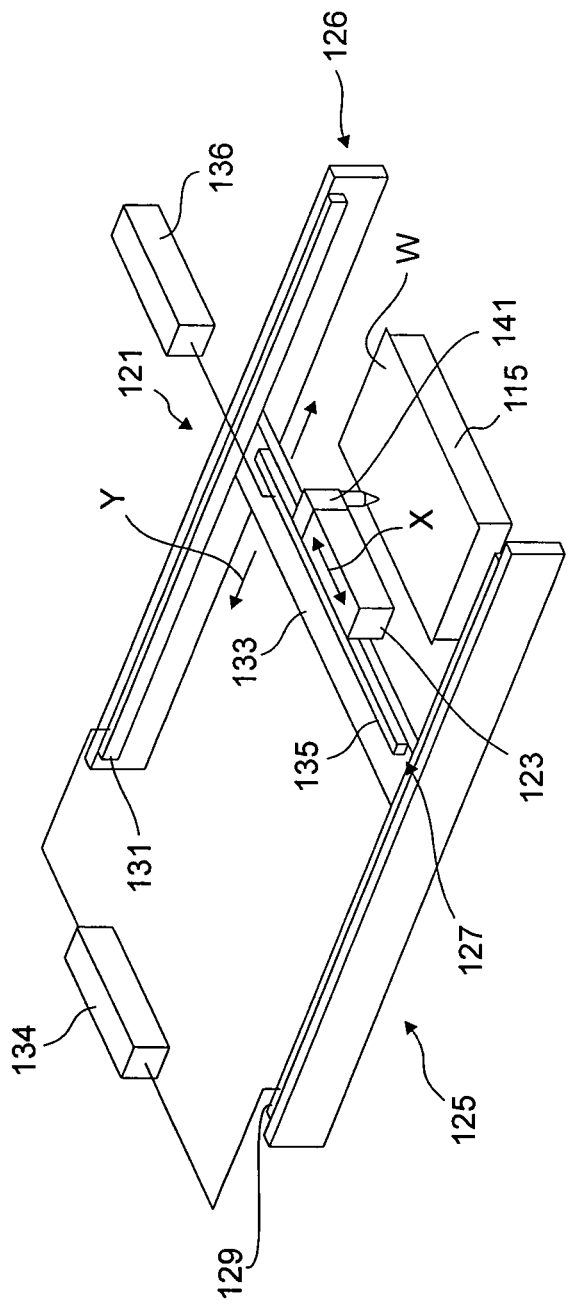
FIG. 2 illustrates a perspective view of the imaging unit of the screen printing machine of FIG. 1.

The screen printing machine comprises a frame support 103 which supports a printing screen unit 105, which comprises a mounting frame 107 and a printing screen 109 which is mounted thereto, and a print head 111 which is movable back and forth across the printing screen 109 to drive a material, such as a solder paste or an adhesive, through a pattern of apertures in the printing screen 109, and deposit the material onto a workpiece W disposed therebeneath.

The screen printing machine further comprises a workpiece support 115 which is disposed beneath the printing screen 109 to support a workpiece W at an operating zone, and a workpiece transport mechanism 117 which includes a pair of transport rails 119, 120 along which workpieces W are transported to and from the workpiece support 115.

The screen printing machine further comprises an imaging unit 121 for capturing images of fiducials on the printing screen 109 and the workpiece W.

In this embodiment the imaging unit 121 comprises a vision camera 123 and a positioning mechanism 125 which is operative to position the vision camera 123 in an X-Y plane between the printing screen 109 and the workpiece W, such that the vision camera 123 captures images of the printing screen 109 and the workpiece W and detects the fiducials thereon. In this embodiment the positioning mechanism 125 is configured to move the vision camera 123 through a predefined path in the X-Y plane in order to capture a sequence of images which includes all of the fiducials.

In this embodiment the positioning mechanism 125 comprises an X-Y gantry which includes first and second positioning units 126, 127, which provide for positioning of the vision camera 123 in respective ones of orthogonal, X-Y axes, such as to be operable together to provide for positioning of the vision camera 123 in the X-Y plane.

In this embodiment the first positioning unit 126, here a Y-axis positioning unit, comprises first and second Y-axis positioners 129, 131, a bridge member 133, which interconnects the first and second Y-axis positioners 129, 131 and is moved by common operation of the same, and at least one, in this embodiment a single actuator 134 for actuating the Y-axis positioners 129, 131, such as to position the vision camera 123 in the Y-axis.

In this embodiment the at least one actuator 134 comprises one of a stepping motor or a servo motor, and includes an encoder which allows for highly-accurate positioning of the vision camera 123.

In this embodiment the second positioning unit 127, here an X-axis positioning unit, comprises an X-axis positioner 135, which is mounted to the bridge member 133 of the Y-axis positioning unit 126 in orthogonal relation to the Y-axis positioners 129, 131, and an actuator 136 for actuating the X-axis positioner 135, such as to position the vision camera 123 in the X-axis.

The screen printing machine further comprises an alignment unit 137, in this embodiment an X-X-Y table, for X, Y and θ alignment of the printing screen unit 105 relative to the workpiece support 115 in response to the imaged fiducials.

In this embodiment the imaging unit 121 further comprises an end effector 141 which is coupled to the vision camera 123, such as to be moved commonly therewith. In this embodiment the end effector 141 has a fixed, offset position relative to the datum of the vision camera 123, which allows for positioning of the end effector 141 in the X-Y plane relative to the workpiece W as required for operation of the end effector 141 on the workpiece W, as will be described in more detail hereinbelow.

In this embodiment the end effector 141 is a material-dispensing effector for dispensing deposits of a material, typically a viscous material or liquid, such as an adhesive, a solder flux or a solder paste, from a reservoir onto a workpiece W in a desired pattern, with the fluid-dispensing effector being controlled to dispense material deposits in dependence on the movement thereof.

In alternative embodiments the end effector 141 could be any other kind of effector for operating in relation to a workpiece W, including but not limited to an ink-jetting effector for delivering a liquid to a workpiece W in a desired pattern, a component-mounting effector for mounting components at defined locations on a workpiece W and a laser-etching effector for laser etching a desired pattern in a workpiece W.

The screen printing machine further comprises a controller 145 for controlling operation of the screen printing machine.

Figure 3:
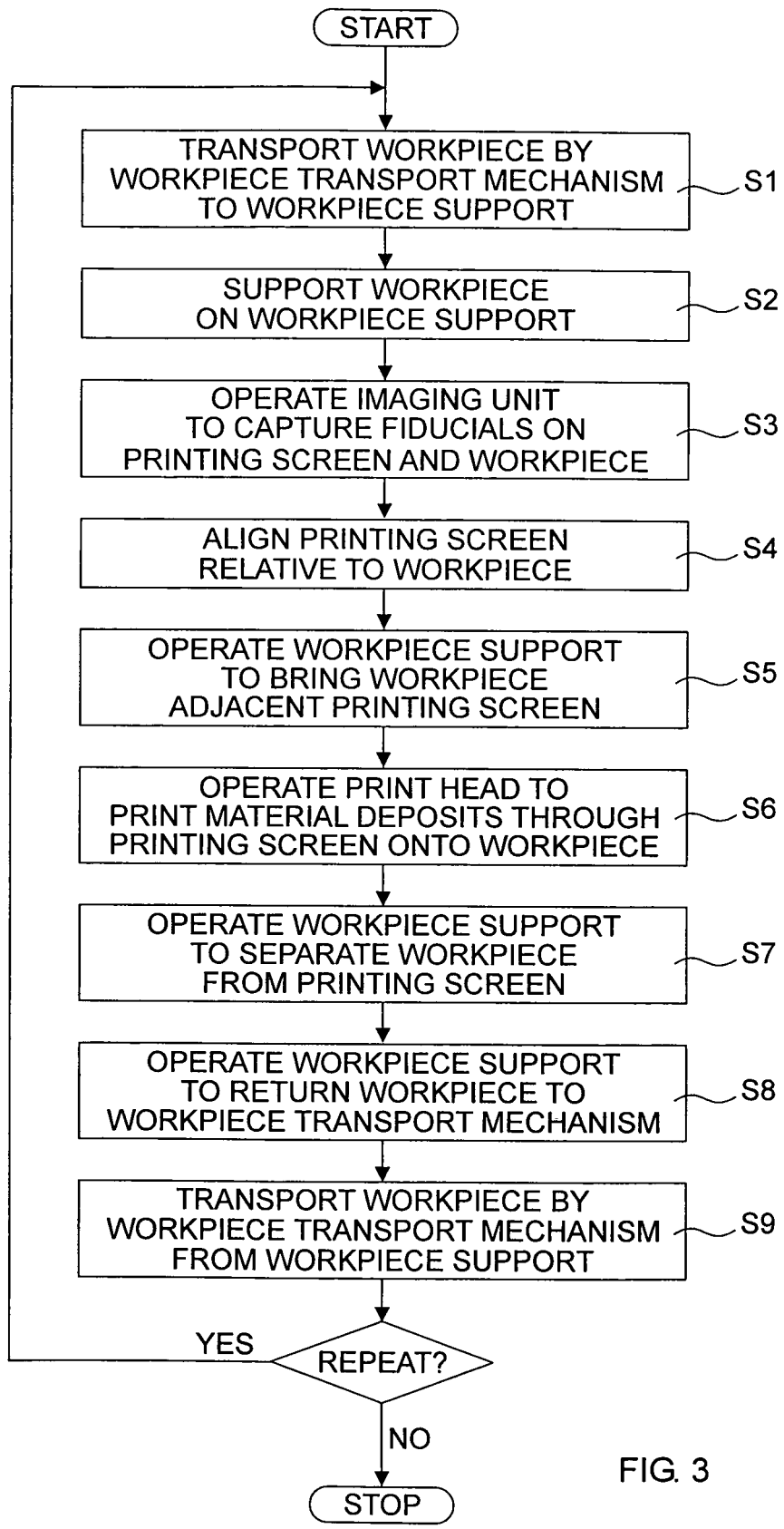
FIG. 3 illustrates a flow chart for one mode of operation of the screen printing machine of FIG. 1.

One mode of operation of the above-described screen printing machine will now be described hereinbelow with particular reference to FIG. 3, where the screen printing machine is operated to provide only for screen printing of material deposits onto a workpiece W.

In a first step (Step S1), a workpiece W, such as a printed circuit board, is transported by the workpiece transport mechanism 117 to a location above the workpiece support 115. In this embodiment workpieces W are automatically transported in succession in accordance with the normal control routine of the screen printing machine.

In a second step (Step S2), the workpiece support 115 is actuated to support the workpiece W as located thereabove by the workpiece transport mechanism 117. In this embodiment the workpiece support 115 is operated automatically in accordance with the normal control routine of the screen printing machine.

In a third step (Step S3), the imaging unit 121 is operated to capture fiducials both on the printing screen 109 and the workpiece W, in this embodiment by operating the positioning mechanism 125 to move the vision camera 123 through the X-Y plane between the printing screen 109 and the workpiece W. In this embodiment the imaging unit 121 is operated automatically in accordance with the normal control routine of the screen printing machine.

In a fourth step (Step S4), the alignment unit 137 is operated to align the printing screen 109 relative to the workpiece W, such as to establish common X-Y axes and a 0, 0 datum. In this embodiment the alignment unit 137 is operated automatically in accordance with the normal control routine of the screen printing machine. In this embodiment the printing screen unit 105 is moved in relation to the workpiece support 115, such as to align the printing screen 109 relative to the workpiece W. In an alternative embodiment the workpiece support 115 could be moved in relation to the printing screen unit 105, such as to align the printing screen 109 relative to the workpiece W.

In a fifth step (Step S5), the workpiece support 115 is operated such as to bring the supported workpiece W into a position adjacent the underside of the printing screen 109. In this embodiment the workpiece support 115 is operated in accordance with the normal control routine of the screen printing machine. In this embodiment the workpiece support 115 is moved in relation to the printing screen 109 vertically to position a supported workpiece W and the printing screen 109 in relation to one another. In alternative embodiments the printing screen 109 could be moved in relation to the workpiece support 115, or both the printing screen 109 and the workpiece support 115 could be moved.

In a sixth step (Step S6), the print head 111 is operated to drive a material through the apertures in the printing screen 109 and print a required pattern of deposits of material, such as one of a solder paste or an adhesive, onto the workpiece W.

In a seventh step (Step S7), the workpiece support 115 is operated to separate the supported workpiece W from the underside of the printing screen 109. In this embodiment the workpiece support 115 is operated in accordance with the normal control routine of the screen printing machine. In this embodiment the workpiece support 115 is moved in relation to the printing screen 109 vertically to position a supported workpiece W and the printing screen 109 in relation to one another. In alternative embodiments the printing screen 109 could be moved in relation to the workpiece support 115, or both the printing screen 109 and the workpiece support 115 could be moved.

In an eighth step (Step S8), the workpiece support 115 is actuated to return the workpiece W to the workpiece transport mechanism 117. In this embodiment the workpiece support 115 is actuated in accordance with the normal control routine of the screen printing machine.

In a ninth step (Step S9), the workpiece transport mechanism 117 is operated to transport the workpiece W from the screen printing machine automatically in accordance with the normal control routine.

This operation is then repeated for each workpiece W to be processed.

Figure 4:
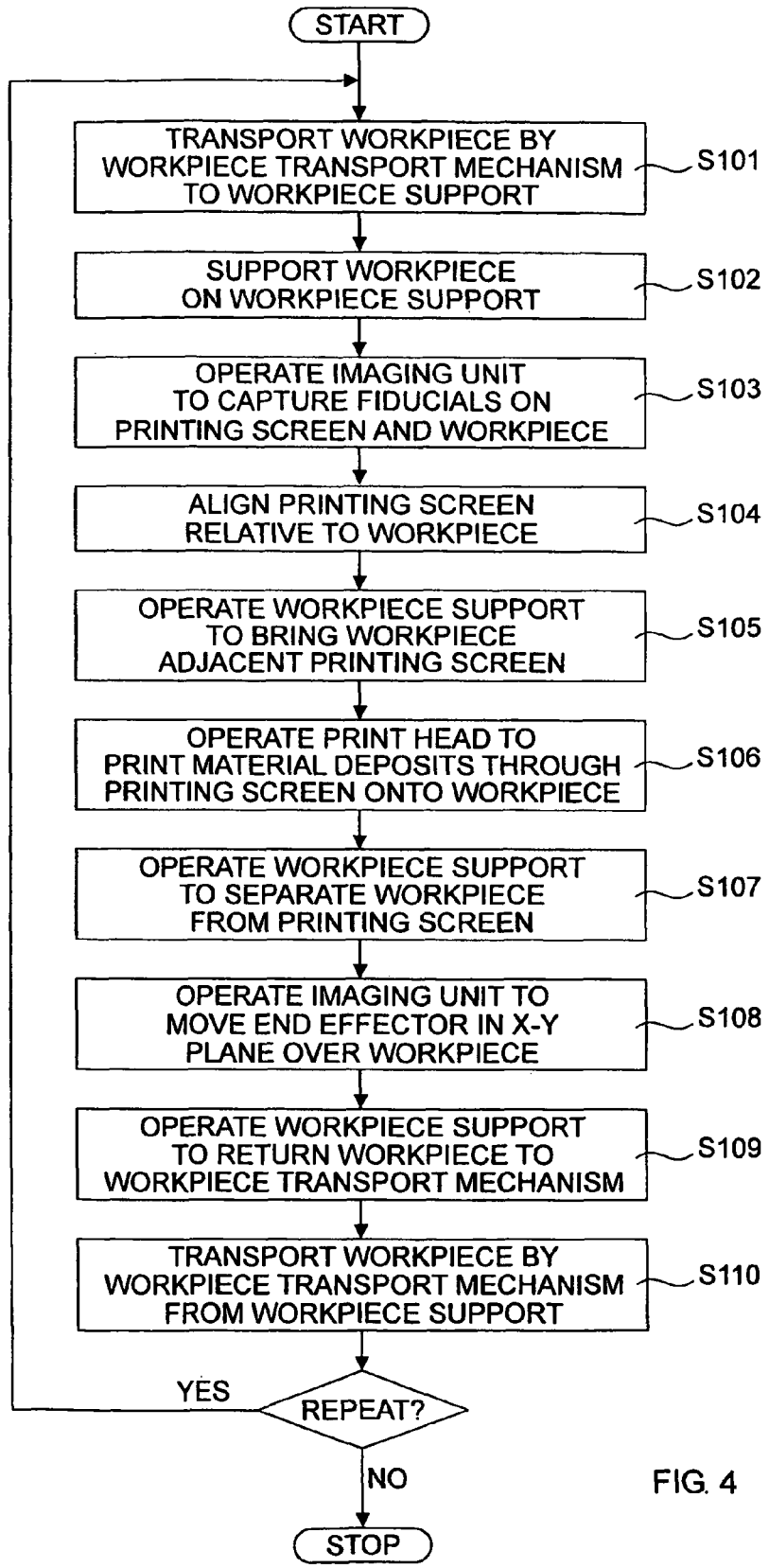
FIG. 4 illustrates a flow chart for another mode of operation of the screen printing machine of FIG. 1.

Another mode of operation of the above-described screen printing machine will now be described hereinbelow with particular reference to FIG. 4, where the screen printing machine is operated to provide both for screen printing and operation on a workpiece W by the end effector 141, in this embodiment direct dispensing of a material onto the workpiece W.

In a first step (Step S101), a workpiece W, such as a printed circuit board, is transported by the workpiece transport mechanism 117 to a location above the workpiece support 115. In this embodiment workpieces W are automatically transported in succession in accordance with the normal control routine of the screen printing machine.

In a second step (Step S102), the workpiece support 115 is actuated to support the workpiece W as located thereabove by the workpiece transport mechanism 117. In this embodiment the workpiece support 115 is operated automatically in accordance with the normal control routine of the screen printing machine.

In a third step (Step S103), the imaging unit 121 is operated to capture fiducials both on the printing screen 109 and the workpiece W, in this embodiment by operating the positioning mechanism 125 to move the vision camera 123 through the X-Y plane between the printing screen 109 and the workpiece W. In this embodiment the imaging unit 121 is operated automatically in accordance with the normal control routine of the screen printing machine.

In a fourth step (Step S104), the alignment unit 137 is operated to align the printing screen 109 relative to the workpiece W, such as to establish common X-Y axes and a 0, 0 datum. In this embodiment the alignment unit 137 is operated automatically in accordance with the normal control routine of the screen printing machine. In this embodiment the printing screen unit 105 is moved in relation to the workpiece support 115, such as to align the printing screen 109 relative to the workpiece W. In an alternative embodiment the workpiece support 115 could be moved in relation to the printing screen unit 105, such as to align the printing screen 109 relative to the workpiece W.

In a fifth step (Step S105), the workpiece support 115 is operated such as to bring the supported workpiece W into a position adjacent the underside of the printing screen 109. In this embodiment the workpiece support 115 is operated automatically in accordance with the normal control routine of the screen printing machine. In this embodiment the workpiece support 115 is moved in relation to the printing screen 109 vertically to position a supported workpiece W and the printing screen 109 in relation to one another. In alternative embodiments the printing screen 109 could be moved in relation to the workpiece support 115, or both the printing screen 109 and the workpiece support 115 could be moved.

In a sixth step (Step S106), the print head 111 is operated to drive a material, such as one of a solder paste or an adhesive, through the apertures in the printing screen 109 and print a required pattern of deposits of the material onto the workpiece W.

In a seventh step (Step S107), the workpiece support 115 is operated to separate the supported workpiece W from the underside of the printing screen 109. In this embodiment the workpiece support 115 is operated automatically in accordance with the normal control routine of the screen printing machine. In this embodiment the workpiece support 115 is moved in relation to the printing screen 109 vertically to position a supported workpiece W and the printing screen 109 in relation to one another. In alternative embodiments the printing screen 109 could be moved in relation to the workpiece support 115, or both the printing screen 109 and the workpiece support 115 could be moved.

In an eighth step (Step S108), the imaging unit 121 is operated such as to move the end effector 141 in the X-Y plane relative to the workpiece W, with the end effector 141 being operated in accordance with a pre-programmed routine, such that the end effector 141 performs the required operation on the workpiece W, in this embodiment in dispensing deposits of a material, such as a solder paste or an adhesive, at required positions and in required volumes. In this embodiment the material deposited by the end effector 141 is the same as that deposited by the print head 111, such as either one of a solder paste or an adhesive, but in an alternative embodiment the materials can be different, such as a solder paste and an adhesive.

In a ninth step (Step S109), the workpiece support 115 is actuated to return the workpiece W to the workpiece transport mechanism 117. In this embodiment the workpiece support 115 is actuated automatically in accordance with the normal control routine of the screen printing machine.

In a tenth step (Step S110), the workpiece transport mechanism 117 is operated to transport the workpiece W from the screen printing machine automatically in accordance with the normal control routine.

This operation is then repeated for each workpiece W to be processed.

Figure 5:
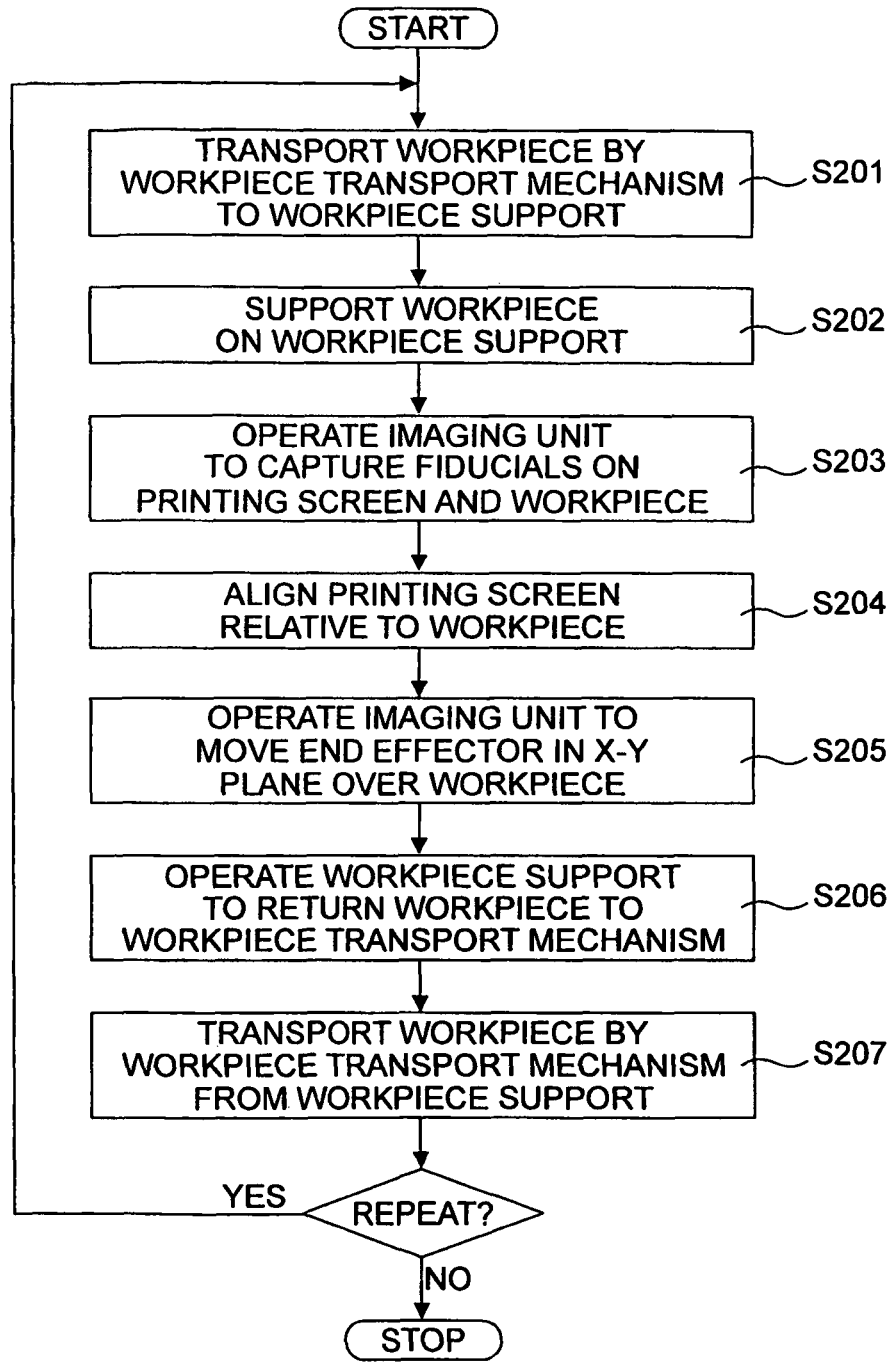
FIG. 5 illustrates a flow chart for a further mode of operation of the screen printing machine of FIG. 1.

A further mode of operation of the above-described screen printing machine will now be described hereinbelow with particular reference to FIG. 5, where the screen printing machine is operated to provide only for operation on the workpiece W by the end effector 141, in this embodiment the direct dispensing of a material onto the workpiece W.

In a first step (Step S201), a workpiece W, such as a printed circuit board, is transported by the workpiece transport mechanism 117 to a location above the workpiece support 115. In this embodiment workpieces W are automatically transported in succession in accordance with the normal control routine of the screen printing machine.

In a second step (Step S202), the workpiece support 115 is actuated to support the workpiece W as located thereabove by the workpiece transport mechanism 117. In this embodiment the workpiece support 115 is operated automatically in accordance with the normal control routine of the screen printing machine.

In a third step (Step S203), the imaging unit 121 is operated to capture fiducials both on the printing screen 109 and the workpiece W, in this embodiment by operating the positioning mechanism 125 to move the vision camera 123 through the X-Y plane between the printing screen 109 and the workpiece W. In this embodiment the imaging unit 121 is operated automatically in accordance with the normal control routine of the screen printing machine.

In a fourth step (Step S204), the alignment unit 137 is operated to align the printing screen 109 relative to the workpiece W, such as to establish common X-Y axes and a 0, 0 datum. In this embodiment the alignment unit 137 is operated automatically in accordance with the normal control routine of the screen printing machine. In this embodiment the printing screen unit 105 is moved in relation to the workpiece support 115, such as to align the printing screen 109 relative to the workpiece W. In an alternative embodiment the workpiece support 115 could be moved in relation to the printing screen unit 105, such as to align the printing screen 109 relative to the workpiece W.

In a fifth step (Step S205), the imaging unit 121 is operated such as to move the end effector 141 in the X-Y plane relative to the workpiece W, with the end effector 141 being operated in accordance with a pre-programmed routine, such that the end effector 141 performs the required operation on the workpiece W, in this embodiment in dispensing deposits of a material, such as a, solder paste or an adhesive, at required positions and in required volumes.

In a sixth step (Step S206), the workpiece support 115 is actuated to return the workpiece W to the workpiece transport mechanism 117. In this embodiment the workpiece support 115 is actuated automatically in accordance with the normal control routine of the screen printing machine.

In a seventh step (Step S207), the workpiece transport mechanism 117 is operated to transport the workpiece W from the screen printing machine automatically in accordance with the normal control routine.

This operation is then repeated for each workpiece W to be processed.

Finally, it will be understood that the present invention has been described in its preferred embodiment and can be modified in many different ways without departing from the scope of the invention as defined by the appended claims.

In one modification, the positioners 129, 131, 135 and associated actuators 134, 136 could be replaced by linear motors.

The invention claimed is:

1. A screen printing machine, comprising:
   a printing screen;
   a print head which is operable to drive a material through the printing screen and deposit the material onto a workpiece;
   an imaging unit which comprises a vision camera for imaging at least one of the printing screen and the workpiece, the vision camera being movable between the printing screen and the workpiece, and a positioning mechanism which is operable to move the vision camera to positions over the surface of the workpiece; and
   a material-dispensing effector which is operable to dispense material deposits on an upper surface of the workpiece in a desired pattern and is coupled to the vision camera to be moved commonly therewith by the positioning mechanism;
   wherein the screen printing machine is operable to print material deposits on an upper surface of the workpiece by operation of the print head, and further dispense material deposits on an upper surface of the workpiece at defined positions by actuation of the effector.

2. The screen printing machine of claim 1, wherein the effector has a fixed, offset position relative to the datum of the vision camera, and the effector is positioned by the positioning mechanism.

3. The screen printing machine of claim 1, further comprising:
   a frame support for supporting a printing screen unit which includes the printing screen having a pattern of apertures therein.

4. The screen printing machine of claim 3, further comprising:
   an alignment unit for aligning the printing screen unit relative to the workpiece in response to features imaged on at least one of the printing screen and the workpiece.

5. The screen printing machine of claim 1, further comprising:
   a workpiece support for supporting the workpiece.

6. The screen printing machine of claim 1, wherein the positioning mechanism is operable to position the vision camera in an X-Y plane.

7. The screen printing machine of claim 6, wherein the positioning mechanism comprises an X-Y gantry.

8. The screen printing machine of claim 6, wherein the positioning mechanism comprises first and second positioning units, which provide for positioning of the vision camera in respective ones of orthogonal, X-Y axes, such as to be operable together to provide for positioning of the vision camera in the X-Y plane.

9. The screen printing machine of claim 8, wherein one, first positioning unit comprises first and second positioners, which are mounted in parallel relation, and a bridge member, which interconnects the first and second positioners, and is moved by common operation of the first and second positioners to position the vision camera in one axis.

10. The screen printing machine of claim 9, wherein the first positioning unit comprises at least one actuator for actuating the first and second positioners thereof.

11. The screen printing machine of claim 10, wherein the at least one actuator comprises one of a stepping motor or a servo motor.

12. The screen printing machine of claim 10, wherein the first positioning unit comprises a single actuator for actuating the first and second positioners thereof.

13. The screen printing machine of claim 9, wherein the other, second positioning unit comprises a positioner, which is mounted to the bridge member of the first positioning unit in orthogonal relation to the first and second positioners thereof, and is operable to position the vision camera in the other, orthogonal axis.

14. The screen printing machine of claim 13, wherein the second positioning unit comprises an actuator for actuating the positioner thereof.

15. The screen printing machine of claim 14, wherein the actuator comprises one of a stepping motor or a servo motor.

16. The screen printing machine of claim 1, wherein the effector is controlled to dispense material deposits in dependence upon the movement thereof.

17. The screen printing machine of claim 1, wherein the materials as deposited by the print head and the effector are different.

18. The screen printing machine of claim 1, wherein the materials as deposited by the print head and the effector are the same.

19. The screen printing machine of claim 1, wherein the materials are selected from a solder paste, a solder flux and an adhesive.

20. A method of operating a screen printing machine, which comprises a print head which is operable to drive a material through a printing screen and deposit the material onto a workpiece, an imaging unit which comprises a vision camera for imaging at least one of the printing screen and the workpiece, the vision camera being movable between the printing screen and the workpiece, and a positioning mechanism which is operable to move the vision camera to positions over the surface of the workpiece, and a material-dispensing effector which is operable to dispense material deposits on an upper surface of the workpiece in a desired pattern and is coupled to the vision camera to be moved commonly therewith, the method comprising the step of:
   operating the screen printing machine in a first mode in which the print head is driven to print material deposits on an upper surface of a workpiece, and a second mode in which the vision camera is moved between the printing screen and the workpiece and the effector is actuated to further dispense material deposits on an upper surface of the workpiece at defined positions.

21. The method of claim 20, wherein the effector has a fixed, offset position relative to the datum of the vision camera, whereby the effector is positioned by the positioning mechanism.

22. The method of claim 20, further comprising the steps of:
- operating the imaging unit to move the vision camera and image features on at least one of the printing screen and the workpiece; and
- aligning the printing screen relative to the workpiece in response to the imaged features.

23. The method of claim 20, wherein the effector is controlled to dispense material deposits in dependence upon the movement thereof.

24. The method of claim 20, wherein the materials as deposited by the print head and the effector are different.

25. The method of claim 20, wherein the materials as deposited by the print head and the effector are the same.

26. The method of claim 20, wherein the materials are selected from a solder paste, a solder flux and an adhesive.

27. The method of claim 20, wherein the workpiece is a printed circuit board.

\* \* \* \* \*